United States Patent
Chu et al.

(10) Patent No.: US 6,203,931 B1
(45) Date of Patent: Mar. 20, 2001

(54) LEAD FRAME MATERIAL AND PROCESS FOR MANUFACTURING THE SAME

(75) Inventors: Chun-Hsun Chu, Chiai; Shyi-Yi Chen, Changhua; Jui-Fen Pai, Nantou, all of (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/245,574

(22) Filed: Feb. 5, 1999

(51) Int. Cl.$^7$ .................................................. B32B 15/01
(52) U.S. Cl. ......................... 428/670; 427/99; 427/124; 427/250; 428/637; 428/644; 428/647; 428/648; 428/652; 428/653; 428/658; 428/659; 428/662; 428/663; 428/664; 428/665; 428/666; 428/667; 428/668; 428/672; 428/673; 428/675; 428/676; 428/678; 428/679; 428/680; 428/926; 428/938
(58) Field of Search ..................................... 428/637, 644, 428/647, 648, 652, 653, 658, 659, 662, 663, 664, 665, 666, 667, 668, 670, 672, 673, 675, 676, 678, 679, 680, 926, 938; 427/99, 124, 250

(56) References Cited

U.S. PATENT DOCUMENTS 5,139,890 * 8/1992 Cowie et al. ........................ 428/670
5,510,197 * 4/1996 Takahashi et al. ................... 428/670

\* cited by examiner

*Primary Examiner*—Deborah Jones
*Assistant Examiner*—Robert R. Koehler
(74) *Attorney, Agent, or Firm*—Townsend and Townsend and Crew LLP

(57) ABSTRACT

The present invention provides a lead frame material and a process for manufacturing a lead frame material. The process includes forming an intermediate layer on a lead frame substrate by vacuum deposition and forming a top protective layer on the intermediate layer by vacuum deposition. By using vacuum deposition, the coating material can be selected from a wider variety of materials; thus, coatings with novel compositions can be formed. The intermediate layer can be Ni, Ag, W, Zn, Cr, Mo, Cu, Sn, Al, Ta, Co, Nb, or alloys thereof, and the top protective layer can be Pt, Ir, Re, Ru, Rh, Pd, Au, Ag, or alloys thereof.

8 Claims, No Drawings

LEAD FRAME MATERIAL AND PROCESS FOR MANUFACTURING THE SAME

BACKGROUND OF THE INVENTION

1. Field of the Invention

The present invention relates to a lead frame material and a process for manufacturing the same, and more particularly to a process for forming a lead frame coating by vacuum deposition. By using vacuum deposition, the coating material can be selected from a wider variety of materials. Coatings with novel compositions can thus be formed.

2. Description of the Prior Art

Copper-based lead frame substrates are dominantly employed in semiconductor device packages primarily because of their superior conductivity. In order to improve copper-based lead frame substrates, one common approach is to enhance the wire bonding, reliability, or solderability of the metal conducting coating on the lead frame substrate, which is called lead frame coating.

Optimal lead frame coatings should be free of lead (Pb) and lead compounds, corrosion resistant, oxidation resistant, resistant to high temperatures (over 200° C.), wire-bondable, and solderable. Many attempts have been made to meet the desirable properties described above. One method is to carry out the wire bonding in vacuum. Another method is to form a gold layer of 5~10 μm thickness or to remove oxides on the surface of the lead frame coating. However, for those conventional methods, production steps and cost are both increased. Moreover, for a high pin lead frame, the neighboring leads will stick together when the lead frame coating is too thick.

Nowadays, the deposition of a lead frame coating such as Cu/Ag, Ni/Ag, and Pd on a lead frame substrate is employed by wet electroplating. The main raw materials for electroplating are cyanides. Since cyanides have high toxicity, they are harmful to humans in lead frame factories, and the waste liquid causes serious environmental problems.

In Taiwan, the deposition of the lead frame coating on a lead frame substrate is also primarily conducted by wet electroplating. Lead frame factories consume a large amount of deionized water or tap water to wash away the residual waste liquid on the lead frame generated by electroplating. For one piece of lead frame, about 0.5 kg to 1 kg of deionized water or tap water is consumed for washing. For a medium-sized lead frame factory, which can produce about 200 million pieces of lead frames per month, the amount of water required for washing is about 200 thousand tons per month.

In addition, it is very difficult to make the current density of the plating solution uniform. Thus, lead frames suffer from many defects including non-uniform color, burnt, incomplete plating, pits, nodules, voids, pin holes, deformation, wrinkles, rust, stains, oxidation, water stains, chemical pollution, discoloration, scratches, silver leakage, silver stains, and silver immersion.

The deposition of lead frame coatings by wet electroplating has other disadvantages, as described below. The silver and copper formed by wet electroplating is very easily oxidized. When the plating solution is polluted, the plating surface will also be polluted and discolored, thus causing difficulty for wire bonding. In the 10 to 20 meter long electroplating production line, the products are very easy to scratch. The products will have water stains after washing with water. Moreover, when the production line is shut down temporarily because of unusual conditions, all the finished and semi-finished products will be immersed in the plating solution or water for a period of time. Thus, the products will be oxidized and discolored, making them useless. In addition, all the plating solution on the production line will need to be changed, making the total cost very high.

In recent years, many researchers have attempted to improve the properties of the lead frame coating by means of changing the plating composition. For example, Takahashi in U.S. Pat. No. 5,510,197 provides a new lead frame material including a base plate of copper or copper alloys, an intermediate layer composed of nickel or nickel alloys, and a protective coating composed of gold, silver, palladium and their alloys. Moon in U.S. Pat. No. 5,750,016 provides a process for plating palladium or its alloy onto an iron-nickel alloy substrate. Mathew in U.S. Pat. No. 5,650,661 provides a new lead frame material including a lead frame substrate, a nickel layer, a copper layer, a tin layer, and a palladium layer in sequence, which are all formed by electroplating. However, the varieties of plating solution for electroplating are limited in number; therefore, the number of suitable plating compositions is limited accordingly.

In summary, deposition of lead frame coating by wet electroplating has the problems of environmental pollution, high cost, low yield, and a limited number of suitable coating compositions.

SUMMARY OF THE INVENTION

The object of the present invention is to solve the above-mentioned problems and to provide a process for manufacturing a lead frame material in which no toxic cyanides are used and the cost is lowered.

Another object of the present invention is to provide a lead frame material with a novel coating composition. By means of a suitable coating composition, the product yield can be increased. If a cheaper coating composition is used, production cost can be lowered.

To achieve these objects, the process for manufacturing a lead frame material comprises:

forming an intermediate layer on a lead frame substrate by vacuum deposition, wherein the intermediate layer is composed of at least one pure metal or a metal alloy and the substrate is made of a material selected from copper, copper alloy, and Fe—Ni alloy; and forming a top protective layer on the intermediate layer by vacuum deposition, wherein the top protective layer is composed of at least one pure noble metal or a noble metal alloy.

According to the present invention, a lead frame material with a novel coating composition comprises:

a lead frame substrate made of a material selected from the group consisting of copper, copper alloy, and Fe—Ni alloy;

an intermediate layer formed on the lead frame substrate, wherein the intermediate layer is composed of at least one metal selected from the group consisting of Ni, Ag, W, Zn, Cr, Mo, Cu, Sn, Al, Ta, Co, Nb and alloys thereof; and a top protective layer formed on the intermediate layer, wherein the top protective layer is composed of at least one noble metal selected from the group consisting of Pt, Ir, Re, Ru, Rh and alloys thereof.

According to the present invention, another lead frame material with a novel composition comprises:

a lead frame substrate made of a material selected from the group consisting of copper, copper alloy, and Fe—Ni alloy;

an intermediate layer formed on the lead frame substrate, wherein the intermediate layer is composed of at least one metal selected from the group consisting of Ag, W, Zn, Cr, Mo, Al, Ta, Co, Nb and alloys thereof; and a top protective layer formed on the intermediate layer, wherein the top protective layer is composed of at least one noble metal selected from the group consisting of Pt, Ir, Re, Ru, Rh, Pd, Au, Ag and alloys thereof.

DETAILED DESCRIPTION OF THE INVENTION

The present invention provides a novel process for manufacturing a lead frame material, in which the lead frame coating is formed by vacuum deposition rather than conventional wet electroplating. By means of vacuum deposition, the coating material is not limited to those that can be formed by wet electroplating and can be selected from a wider variety of materials. Coatings with novel compositions can thus be formed.

According to the present invention, the lead frame coating includes two layers, an intermediate layer formed on a lead frame substrate and a top protective layer formed on the intermediate layer. Both layers are formed by vacuum deposition. The lead frame substrate is made of a material selected from copper, copper alloy, and Fe—Ni alloy. Since the intermediate layer and top protective layer are both formed by vacuum deposition, the coating material of the two layers is not limited to those that can be formed by wet electroplating.

Specifically speaking, by means of vacuum deposition, the intermediate layer is not limited to Ni, Cu, Sn, or their alloys, which can be formed by conventional wet electroplating. The intermediate layer can be composed of at least one pure metal or a metal alloy having high thermal and electrical conductivity, such as Ag, W, Zn, Cr, Mo, Al, Ta, Co, Nb, or their alloys, in addition to Ni, Cu, Sn, and their alloys. Also, the top protective layer of the present invention is composed of at least one pure noble metal or a noble metal alloy having high thermal and electrical conductivity, including not only Pd, Au, Ag, and their alloys that can be formed by conventional electroplating, but also Pt, Ir, Re, Ru, Rh, and their alloys.

The purpose of the intermediate layer is to enhance the solderability and adherence of the lead frame coating and to prevent the components of the copper substrate from penetrating into the surface of the lead frame material, which will adversely affect the strength of the wire-bonding. The purpose of the top protective layer is to prevent the surface of the lead frame material from oxidation and to impart thermal resistance to the lead frame material.

Therefore, the lead frame coating of the present invention can include any possibly formed intermediate layer and a top protective layer that is first provided in the present invention. In addition, the lead frame coating of the present invention can include any possibly formed top protective layer and an intermediate layer that is first provided in the present invention.

That is to say, according to the first kind of lead frame material with a novel composition of the present invention, the intermediate layer is composed of at least one metal selected from Ni, Ag, W, Zn, Cr, Mo, Cu, Sn, Al, Ta, Co, Nb, and alloys thereof; and the top protective layer is composed of at least one noble metal selected from Pt, Ir, Re, Ru, Rh and alloys thereof.

According to the second kind of lead frame material with a novel composition of the present invention, the intermediate layer is composed of at least one metal selected from Ag, W, Zn, Cr, Mo, Al, Ta, Co, Nb and alloys thereof; and the top protective layer is composed of at least one noble metal selected from Pt, Ir, Re, Ru, Rh, Pd, Au, Ag and alloys thereof.

The vacuum deposition used in the present invention can be physical vapor deposition or chemical vapor deposition. For example, physical vapor deposition includes vacuum sputtering, vacuum thermal evaporation, and ion beam deposition. Chemical vapor deposition can be plasma enhanced CVD.

The thickness of the intermediate and top protective layers is not limited. For example, the intermediate layer can has a thickness of 0.05 $\mu$m to 2.5 $\mu$m, and the top protective layer can have a thickness of 100 Å to 800 Å.

The conventional process for coating copper as an intermediate layer and silver as a top protective layer on a lead frame substrate by wet electroplating includes 13 steps as shown in Table 1. In contrast, by means of vacuum deposition in the present invention, silver and copper can be coated simultaneously; thus, only 5 steps are needed. Since the coating steps are greatly decreased, the probability of defects can be decreased; therefore, the product yield can be increased. Moreover, no cyanides are needed during vacuum deposition, and environmental pollution can be significantly decreased. Moreover, the vacuum deposition has other advantages: the process is stable, repeatability and reliability are good, and the thickness of the top protective layer can be thinner.

TABLE 1

| Wet Electroplating | Vacuum Deposition |
|---|---|
| Defatting | Defatting |
| ↓ | ↓ |
| Washing | Washing |
| ↓ | ↓ |
| Electroplating and Defatting | Electroplating and Defatting |
| ↓ | ↓ |
| Washing | Washing |
| ↓ | ↓ |
| Copper Plating | Copper and Silver Plating |
| ↓ | |
| Washing | |
| ↓ | |
| Silver Plating | |
| ↓ | |
| Washing | |
| ↓ | |
| Silver Removing | |
| ↓ | |
| Washing | |
| ↓ | |
| Adding Antioxidant | |
| ↓ | |
| Washing | |
| ↓ | |
| Drying | |

The following examples are intended to illustrate the process and the advantages of the present invention more fully without limiting its scope, since numerous modifications and variations will be apparent to those skilled in the art.

EXAMPLES 1–5

TAMAC194 copper-based lead frame containing 2. 12.6 wt % of Fe, 0.015~0.15 wt % of P, 0.05~0.2 wt % of Zn, less than 0.03 wt % of Pb, and higher than 97 wt % of Cu was defatted, acid washed, water washed, and then cleaned with vacuum plasma. The treated substrate was placed in a vacuum deposition system for coating. A Ni intermediate layer, which is conventionally used in wet electroplating, having a thickness of 1.5 μm was coated on the substrate. Then, Pt, Pt—Ir, Ir—Re, Ir—Ru, or Rh layer having a thickness of 500 Å was coated on the Ni intermediate layer as the top protective layer. The composition for each lead frame material is summarized in Table 2.

The conditions of the vacuum deposition were as follows: RF magnetron sputtering system, pressure of Ar-10 mtorr.

Subsequently, the lead frame materials were evaluated by the following analysis according to U.S. Pat. No. 5,650,016.

(A) Wire bonding of each of the lead frame materials by gold wires was conducted to observe whether the gold wires could be adhered to the surface of the lead frame material.

Wire bonding: thermosonic wire bonding

Bonding wire: gold wire of diameter of 25 μm.

Ball size: 75 μm diameter (B) Each of the lead frame materials was baked at 400° C. for 2 minutes, and then the appearance of the of the sample was evaluated with a magnifying glass (20×) or the naked eye to observe if there were defects such as blisters, lifting, peeling, or bleeding.

(C) Apiece of an adhesive tape (3M Tape #810) was attached across the strip of the sample and pressed together firmly with fingers. Then, the tape was removed by a sharp peeling motion to observe if the lead frame coating peeled off.

(D) The sample was scratched with a needle. Then, the appearance of the sample was evaluated by microscopy to observe whether there was peeling or lifting.

The lead frame materials showed good results for the four types of analysis, (A), (B), (C), and (D).

EXAMPLES 6–8

Procedures as described in Examples 1–5 were employed, except that the top protective layer was changed to Ag, Pd, or Au, which is commonly used in conventional wet electroplating. The compositions of the lead frame materials were shown in Table 3. The lead frame materials showed good results for the four types of analysis.

The results of Examples 6–8 show that the commonly used intermediate layers in wet electroplating, such as Ni, and the commonly used top protective layers in wet electroplating, such as Ag, Pd, or Au, can also be effectively formed by the vacuum deposition of the present invention. In addition, the results of Examples 1–5 show that the top protective layer can be chosen from a broader selection of materials than one formed by wet electroplating. For example, a top protective layer of Pt, Pt—IR, Ir—Re, Ir—Ru, or Rh can be formed by vacuum deposition.

EXAMPLES 9–29

Procedures as described in Examples 1–5 were employed, except that the top protective layer was a Pt—Ir layer and the intermediate layer was changed to Cu or Sn, which is commonly used in wet electroplating, or W, Zn, Al, Cr, Mo, Ag, Ta, Co, or Nb, which is for the first time deposited by the process of the present invention. A Cu or Fe—Ni 42 wt % lead frame was used as the substrate. The compositions of the lead frame materials are shown in Table 4. The lead frame materials showed good results for the four types of analysis.

The results of Examples 9–29 show that the intermediate layer can be chosen from a broader selection of materials than one formed by wet electroplating. For example, the intermediate layer of W, Zn, Al, Cr, Mo, Ag, Ta, Co, Nb can be formed by vacuum deposition.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application, thereby enabling those skilled in the art to utilize the invention in various embodiments and with various modifications as suited to the particular use contemplated. All such modifications and variations are within the scope of the present invention as determined by the appended claims when interpreted in accordance with the breadth to which they are fairly, legally, and equitably entitled.

TABLE 2

| Example | Top Protective Layer | Intermediate Layer | Lead Frame Substrate |
|---|---|---|---|
| 1 | Pt | Ni | Cu |
| 2 | Pt—Ir | Ni | Cu |
| 3 | Ir—Re | Ni | Cu |
| 4 | Ir—Ru | Ni | Cu |
| 5 | Rh | Ni | Cu |

TABLE 3

| Example | Top Protective Layer | Intermediate Layer | Lead Frame Substrate |
|---|---|---|---|
| 6 | Ag | Ni | Cu |
| 7 | Pd | Ni | Cu |
| 8 | Au | Ni | Cu |

TABLE 4

| Example | Top Protective Layer | Intermediate Layer | Lead Frame Substrate |
|---|---|---|---|
| 9 | Pt—Ir | Cu | Fe—Ni |
| 10 | Pt—Ir | W | Cu |
| 11 | Pt—Ir | W | Fe—Ni |
| 12 | Pt—Ir | Zn | Cu |
| 13 | Pt—Ir | Zn | Fe—Ni |
| 14 | Pt—Ir | Al | Cu |
| 15 | Pt—Ir | Al | Fe—Ni |
| 16 | Pt—Ir | Cr | Cu |
| 17 | Pt—Ir | Cr | Fe—Ni |
| 18 | Pt—Ir | Mo | Cu |
| 19 | Pt—Ir | Mo | Fe—Ni |
| 20 | Pt—Ir | Ag | Cu |
| 21 | Pt—Ir | Ag | Fe—Ni |
| 22 | Pt—Ir | Sn | Cu |
| 23 | Pt—Ir | Sn | Fe—Ni |
| 24 | Pt—Ir | Ta | Cu |
| 25 | Pt—Ir | Ta | Fe—Ni |
| 26 | Pt—Ir | Co | Cu |
| 27 | Pt—Ir | Co | Fe—Ni |
| 28 | Pt—Ir | Nb | Cu |
| 29 | Pt—Ir | Nb | Fe—Ni |

What is claimed is:

1. A process for manufacturing a lead frame material, comprising:

forming an intermediate layer on a lead frame substrate by chemical vapor deposition, wherein the intermediate layer is composed of at least one pure metal or a metal alloy and the substrate is made of a material selected from copper, copper alloy, and Fe—Ni alloy; and forming a top protective layer on the intermediate layer by chemical vapor deposition, wherein the top protective layer is composed of at least one pure noble metal or a noble metal alloy.

2. The process as claimed in claim 1, wherein the metal of the intermediate layer is selected from the group consisting of Ni, Ag, W, Zn, Cr, Mo, Cu, Sn, Al, Ta, Co, and Nb.

3. The process as claimed in claim 1, wherein the noble metal of the top protective layer is selected from the group consisting of Pt, Ir, Re, Ru, Rh, Pd, Au, and Ag.

4. The process as claimed in claim 1, wherein the intermediate layer has a thickness of 0.05 $\mu$m to 2.5 $\mu$m.

5. The process as claimed in claim 1, wherein the top protective layer has a thickness of 100 Å to 800 Å.

6. A lead frame material, comprising:

a lead frame substrate made of a material selected from the group consisting of copper, copper alloy, and Fe—Ni alloy;

an intermediate layer formed on the lead frame substrate, wherein the intermediate layer is composed of at least one metal selected from the group consisting of Ni, Ag, W, Zn, Cr, Mo, Cu, Sn, Al, Ta, Co, Nb, and alloys thereof; and a top protective layer formed on the intermediate layer, wherein the top protective layer is composed of at least one noble metal selected from the group consisting of Pt, Ir, Re, Ru, Rh and alloys thereof.

7. The lead frame material as claimed in claim 6, wherein the intermediate layer has a thickness of 0.05 $\mu$m to 2.5 $\mu$m.

8. The lead frame material as claimed in claim 6, wherein the top protective layer has a thickness of 100 Å to 800 Å.

* * * * *